(12) United States Patent
Hu et al.

(10) Patent No.: US 11,579,677 B2
(45) Date of Patent: Feb. 14, 2023

(54) MEMRISTOR CROSSBAR ARRAYS TO ACTIVATE PROCESSORS

(71) Applicant: HEWLETT PACKARD ENTERPRISE DEVELOPMENT LP, Houston, TX (US)

(72) Inventors: Miao Hu, Palo Alto, CA (US); Tsung-Ching Huang, Palo Alto, CA (US); Chin-Hui Chen, Palo Alto, CA (US); Raymond G Beausoleil, Seattle, WA (US); John Paul Strachan, Palo Alto, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 1280 days.

(21) Appl. No.: 16/062,882

(22) PCT Filed: Dec. 18, 2015

(86) PCT No.: PCT/US2015/066902
§ 371 (c)(1),
(2) Date: Jun. 15, 2018

(87) PCT Pub. No.: WO2017/105517
PCT Pub. Date: Jun. 22, 2017

(65) Prior Publication Data
US 2018/0364785 A1    Dec. 20, 2018

(51) Int. Cl.
*G06F 1/3206*    (2019.01)
*G11C 13/00*    (2006.01)
(Continued)

(52) U.S. Cl.
CPC .......... *G06F 1/3206* (2013.01); *G06F 1/3243* (2013.01); *G06N 3/04* (2013.01);
(Continued)

(58) Field of Classification Search
CPC ....... G06F 1/3206; G06F 1/3243; G06N 3/04; G11C 11/5685; G11C 13/004;
(Continued)

(56) References Cited

U.S. PATENT DOCUMENTS 6,735,579 B1    5/2004    Woodall
H2215 H          4/2008    Allen et al.
(Continued)

OTHER PUBLICATIONS

International Searching Authority, The International Search Report and the Written Opinion, PCT/US2015/066902, dated Aug. 24, 2016, 10 Pgs.
(Continued)

*Primary Examiner* — Nimesh G Patel
(74) *Attorney, Agent, or Firm* — Wall and Tong, LLP (57) ABSTRACT

In one example, a device to process analog sensor data is described. For example, a device may include at least one analog sensor to generate a first set of analog voltage signals and a crossbar array including a plurality of memristors. In one example, the crossbar array is to receive an input vector of the first set of analog voltage signals, generate an output vector comprising a second set of analog voltage signals that is based upon a dot product of the input vector and a matrix comprising resistance values of the plurality of memristors, detect a pattern of the output vector, and activate a processor upon a detection of the pattern.

16 Claims, 6 Drawing Sheets

(51) Int. Cl.
  *G11C 27/00* (2006.01)
  *G11C 11/56* (2006.01)
  *G06F 1/3234* (2019.01)
  *G06N 3/04* (2006.01)

(52) U.S. Cl.
  CPC ........ *G11C 11/5685* (2013.01); *G11C 13/004* (2013.01); *G11C 13/0007* (2013.01); *G11C 13/0069* (2013.01); *G11C 27/00* (2013.01); *G11C 2213/77* (2013.01)

(58) Field of Classification Search
  CPC . G11C 13/0007; G11C 13/0069; G11C 27/00; G11C 2213/77
  See application file for complete search history.

(56) References Cited

U.S. PATENT DOCUMENTS

| | | | |
|---|---|---|---|
| 8,742,901 | B2 | 6/2014 | Miller et al. |
| 9,063,731 | B2 | 6/2015 | Heo et al. |
| 2013/0028004 | A1 | 1/2013 | Snider |
| 2013/0135925 | A1 | 5/2013 | Scheuerlein |
| 2013/0258087 | A1* | 10/2013 | Jeong ................ H04M 1/72403 348/77 |
| 2014/0013141 | A1* | 1/2014 | Heo ...................... G06F 1/3215 713/323 |
| 2014/0133211 | A1 | 5/2014 | Nazarian et al. |
| 2014/0145860 | A1* | 5/2014 | Park ........................ H04Q 9/00 340/870.01 |
| 2014/0215235 | A1 | 7/2014 | Lipasti et al. |
| 2014/0237277 | A1 | 8/2014 | Mallinson et al. |
| 2015/0347896 | A1* | 12/2015 | Roy ................. H03K 3/356104 706/29 |
| 2017/0091620 | A1* | 3/2017 | Gokmen ................ G06N 3/04 |

OTHER PUBLICATIONS

Geoff Jackson, "Competence Acquisition in an Autonomous Mobile Robot Using Hardware Neural Techniques", NIPS'95 Proceedings 8th Intl Conf Neural Info Proc Nov. 27-Dec. 2, 1995.

* cited by examiner

MEMRISTOR CROSSBAR ARRAYS TO ACTIVATE PROCESSORS

BACKGROUND

Vector-matrix processing techniques are utilized in many computing applications. For example, vector-matrix operations are utilized in data-compression, digital data processing, neural networks, encryption and optimization, to name a few.

DETAILED DESCRIPTION

In one example, the present disclosure describes a device to process analog sensor data. For example, a device may include at least one analog sensor to generate a first set of analog voltage signals and a crossbar array including a plurality of memristors. In one example, the crossbar array is to receive an input vector of the first set of analog voltage signals, generate an output vector comprising a second set of analog voltage signals that is based upon a dot product of the input vector and a matrix comprising resistance values of the plurality of memristors, detect a pattern of the output vector, and activate a processor upon a detection of the pattern.

In another example, the present disclosure describes a system to process analog sensor data. For example, the system may include at least one analog sensor to generate a first set of analog voltage signals and a crossbar array including a plurality of memristors. In one example, the crossbar array is to generate a second set of analog voltage signals that is based upon the first set of analog voltage signals and resistance values of the plurality of memristors, and to activate a processor when at least a portion of the second set of analog voltage signals matches a pattern. The system may further include a programming unit to determine the resistance values of the plurality of memristors.

In another example, the present disclosure describes a device to program a memristor-based crossbar array for processing analog sensor data. The device may include a processor and a non-transitory computer-readable medium storing instructions which, when executed by the processor, cause the processor to determine target resistance values for memristors of a crossbar array to represent a neural network for processing analog sensor data to detect a pattern, provide a first set of voltage signals to program the plurality of memristors of the crossbar array, the first set of voltage signals based upon the target resistance values, determine an accuracy of the crossbar array in detecting the pattern in the analog sensor data, and provide a second set of voltage signals to reprogram the plurality of memristors to improve the accuracy of the crossbar array in detecting the pattern in the analog sensor data.

Electronic sensors are utilized in a variety of contexts to detect physical parameters relating to an environment, a human or animal body, a device, a machine, and so forth. For example, a number of sensors may be used to collect data from a human body to monitor its health status and take action when an emergency occurs. In another example, sensors may be used to detect temperatures, smoke levels, or light levels within a manufacturing facility. In examples of the present disclosure, a memristor-based crossbar array, also referred to herein as a dot product engine (OPE), is utilized as a pre-processor for sensor data that is input to a processor. The processor may comprise a digital processor, such as a CPU, a microprocessor embedded in a sensor device, and so forth. In one example, the crossbar array comprises a passive analog processor that functions as an efficient neural network to recognize patterns in analog sensor data.

For example, one or more sensors may generate analog sensor data, e.g., analog voltage signals, that are fed to a crossbar array as an input vector. In one example, the analog sensor data is sampled by analog buffers to collect sensor data over a period of time, or from several time intervals. The crossbar array may function as a neural network for pre-processing the input vector to generate an output vector of analog voltage signals. For instance, resistance values of the memristors of the crossbar array may be programmed to represent a matrix, where the matrix may represent a linear transfer function of a neural network. A resistance value of a memristor may also be referred to as a memristance.

Previous approaches may include monitoring a sensor with a CPU to determine whether to take action in response to sensor data. However, this arrangement may consume a significant quantity of power and CPU cycles. For example, a traditional smart watch may utilize an onboard CPU to pull sensor data from the sensors and to process the sensor data. The CPU remains active and processes the sensor data on an ongoing basis. Another approach may include analog processing of the sensor data utilizing amplifiers, capacitors and floating gates. Again, however, a large power consumption is typically associated with the use of these active components. The circuit design may also be complex, in addition to occupying a large chip area. In contrast, examples of the present disclosure utilize less power insofar as a crossbar array includes memristors functioning as resistors within an operational range and which are utilized as a linear transform representing a neural network. For instance, a crossbar array may be used to perform a vector matrix multiplication on an input vector of analog voltage signals to generate an output vector of analog voltage signals. When a pattern is detected in the output vector, the processor may be activated. Otherwise, the processor may be kept powered off, or in a low power state. These and other aspects of the present disclosure are described in greater detail below in connection with the example FIGS. 1-6.

Figure 1:
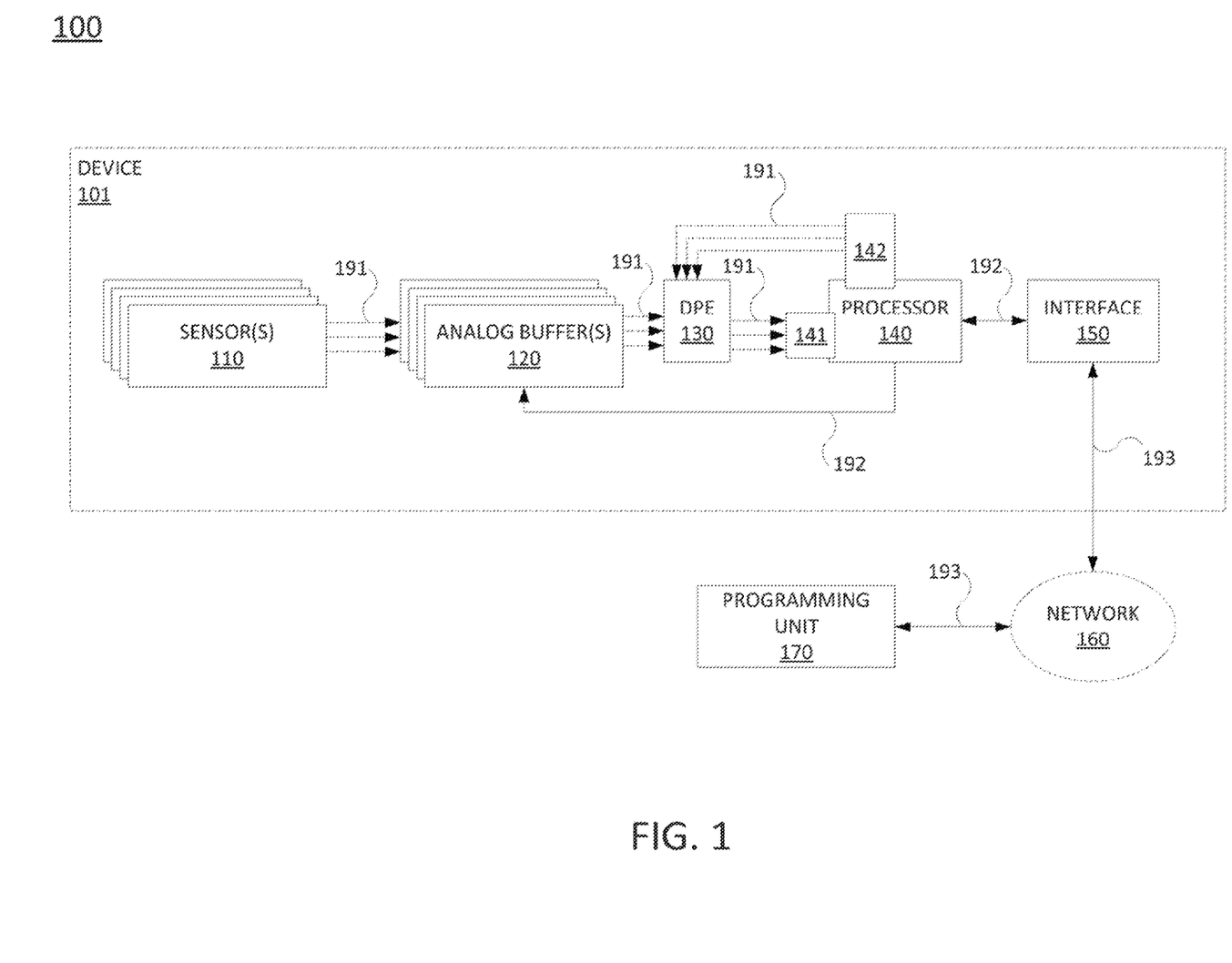
FIG. 1 illustrates an example system of the present disclosure.

FIG. 1 illustrates an example system 100 of the present disclosure for processing analog sensor data, e.g., a first set of analog voltage signals. In one example, the system 100 may include a device 101 that may comprise one or more sensors 110, one or more analog buffers 120, a crossbar array, or dot product engine (DPE) 130, a processor 140, and an interface 150 for external communications. The device 101 may further include one or more analog-to-digital converters 141 for converting an output vector of a second set of analog voltage signals from the DPE 130 into digital output signals, and one or more digital-to-analog converters 142 to output a third set of analog voltage signals in order to program resistance values of a plurality of memristors of the DPE 130. Various components of device 101 may be interconnected via links 191, e.g., for analog signals, and links 192, e.g., for digital signals.

Figure 6:
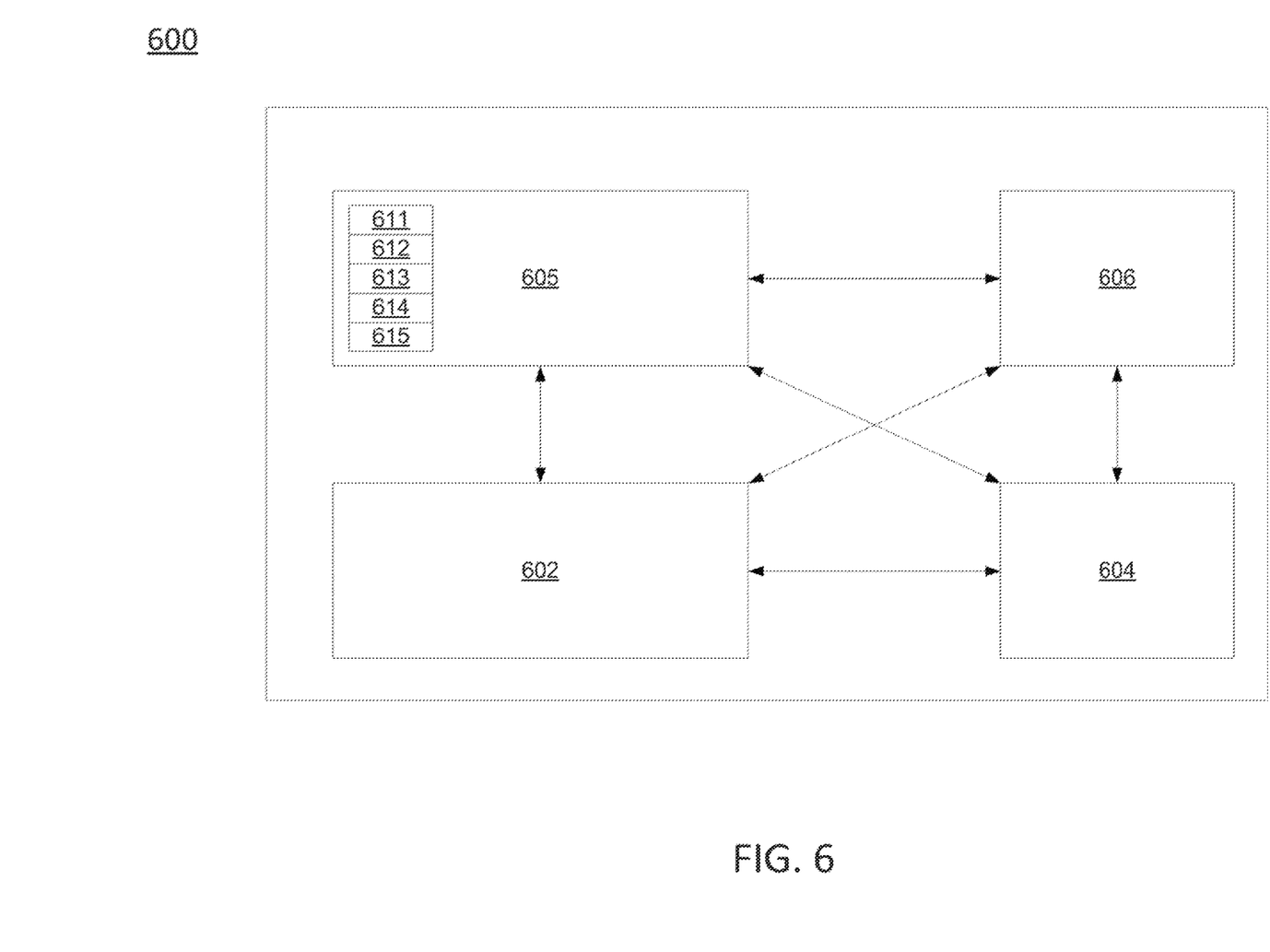
FIG. 6 depicts a high-level block diagram of an example computer that can be transformed into a machine capable of performing the functions described herein.

In one example, device 101 may connect to other devices, such as programming unit 170, via interface 150. For instance, in one example interface 150 may comprise a wireless transceiver. In another example, interface 150 may comprise an Ethernet transceiver for wired communications. Thus, in various examples, the link 193 between interface 150 and network(s) 160 may represent a wireless link, e.g., an Institute of Electrical and Electronics Engineers (IEEE) 802.11 link, a Bluetooth or Bluetooth Low Energy (BLE) connection, or the like, an Ethernet cable, a high definition multimedia interface (HDMI) cable, and the like, a combination of these and other types of physical connections traversing multiple network(s) 160, and so on. A similar link 193 between programming unit 170 and network(s) 160 may be further provided. In this regard, network(s) 160 may represent a wired or wireless local area network (LAN), a point-to-point wireless or wired communication link, a cellular access network, a transport network, the Internet in general, a combination of any of such networks, a virtual private network (VPN) traversing one or more of such networks, and so forth. In one example, the programming unit 170 may comprise a computing device having a processor and a non-transitory computer-readable medium as illustrated in FIG. 6 and described in greater detail below. In one example, the programming unit 170 may comprise a remote network-based device. For instance, programming unit may comprise a server or a virtual machine running on a host device deployed in the cloud, in the network of a service provider or vendor, and so forth.

The sensor(s) 110 may generate analog sensor data relating to various physical parameters. For example, sensor(s) 110 may include temperature sensors, pressure sensors, light sensors, e.g., photodetectors, voltage or current sensors, electromagnetic flux sensors, humidity sensors, chemical sensors/detectors, gyroscopes, accelerometers, microphones, and so forth. Analog sensor data may therefore include measurements of temperature, humidity, atmospheric pressure, sound level, noise level, air quality, wind speed, chemical concentration, electrocardiogram readings, pulse readings, blood pressure readings, and so forth. Analog sensor data may also comprise status indications, such as whether a door is open or closed, whether an optical or electromagnetic signal is detected, whether a device is turned on or off, and so forth.

Although analog sensor data may relate to various physical parameters, the sensor(s) 110 may each output an analog voltage signal that is representative of the physical parameter measured by the respective one of the sensor(s) 110. For instance, a first sensor of the sensor(s) 110 may output a first analog voltage signal that is proportional to a temperature, a second sensor of the sensor(s) 110 may output a second analog voltage signal that is proportional to a pressure, and so on. In addition, although some types of sensor data may take discrete voltage values, it may still be processed as analog sensor data via example devices and systems of the present disclosure. Collectively, the analog voltage signals from the sensor(s) 110, or "sensor data," may comprise a first set of analog voltage signals.

DPE 130 may comprise an array of N rows and M columns to perform vector-matrix or dot product computations with respect to an input vector of the first set of analog voltage signals. For example, an input analog voltage signal from each row of the crossbar array may be weighted by the conductance of the memristors in each column and accumulated as the current output from each column. Ideally, if wire resistances can be ignored, the functioning of the DPE 130 can be represented by $V_o^T = -V_i^T \cdot R_s$, where $V_o^{T_1}$ is the transpose of an output vector comprising a second set of analog voltage signals, $V_i^T$ is the transpose of the input vector, G is the conductance matrix of DPE 130, including contributions from each memristor in the DPE 130, $R_s$ is a vector representing the resistances of sense circuits at the output of each column of the OPE 130, and where the negative sign follows from a presence of negative feedback operational amplifiers in sense circuits at an output of the DPE 130, in one example. The use of a memristor at each junction or cross point of DPE 130 enables programming the resistance (or conductance) at each such junction corresponding to the values of G, leading to use of the crossbar array as a dot product engine (OPE). An example crossbar array, or DPE is described in greater detail below in connection with the example of FIG. 3.

In one example, a neural network can be represented by a matrix to map an input vector to an output vector. Various hidden states of the neural network may be abstracted by linear transformations that may be provided by dot product vector multiplication of an input vector by the matrix. In one example, programming unit 170 may determine a matrix, e.g., a linear transform or linear filter, that best approximates a neural network to perform a particular function, such as a pattern detection. For instance, a model neural network may be for classifying human activity into one of several classes, e.g., walking, running, jumping, sitting, standing, falling, lying down, or undefined. The last class may include a number of activities that may occur less frequently or are of lesser importance, such as swimming, cycling, skiing, and so forth. In one example, the neural network may be for processing input sensor data from a gyroscope and three accelerometers, one for each spatial dimension, to generate a set of outputs that is indicative of one of the possible states.

In one example, the programming unit 170 may determine the matrix representing the neural network and may provide the matrix values to the processor 140 via network(s) 160, link(s) 193, and/or interface 150. In one example, processor 140 may map the matrix values into programming signals to generate a third set of analog voltage signals via digital-to-analog converter(s) 142. It should be noted that in various examples, digital-to-analog converters 142 may be integrated within processor 140 or may be separate component(s) deployed between and coupled to the processor 140 and the DPE 130, respectively. The third set of analog voltage signals may be used to program the resistance values (or conductances) of the memristors of the DPE 130. In one example, processor 140 may also generate a set of control signals to control drivers and address decoders of the respective rows and columns of the DPE 130 in order to select each memristor in the DPE 130 for programming. In one example, the control signals may be conveyed via a link 192.

In one example, the programming signals and/or the third set of analog voltage signals may be calculated to result in a set of target resistances (or conductances) of the memristors in the DPE 130 and to provide a target transfer function of the DPE 130. However, due to variations of the memristors' physical properties and/or wire resistance, input resistance, output resistance, shot noise, Johnson noise, and other factors related to the DPE 130, the memristors may not actually take on the target values. In one example, processor 140 may test the configuration of DPE 130 to adjust the resistances (or conductances) of the memristors to achieve a transfer function that is ideal, or that is a sufficient approximation of the target transfer function, e.g., within a tolerable deviation from the target transfer function as determined by an operator of the device, a sensor vendor, a sensor data monitoring service provider, and so forth. For instance, the processor 140 may inject one or more test input vectors to DPE 130, read the output vectors, and determine whether any adjustment needs to be made to any of the memristor resistances (or conductances) in order to better approximate the target transfer function.

In one example, the third set of analog voltage signals output by digital-to-analog converter(s) 142 is of sufficient magnitude to program, reprogram or reset the resistance (or conductance) of a memristor of the DPE 130. In contrast, the first set of analog voltage signals comprising the input vector to DPE 130 from sensor(s) 110 and/or analog buffer(s) 120 may be sub-threshold voltages. In other words, the first set of analog voltage signals of the input vector to DPE 130 will not reprogram the memristors. Thus, with respect to the first set of analog voltage signals of the input vector, the memristors of the DPE 130 function as resistors with fixed resistance and conductance values.

In various examples, detecting patterns of human activity (as well as other pattern matching applications) may involve processing sensor data from sensor(s) 110 over successive time periods. Thus, for example, the first set of analog voltage signals comprising the input vector to DPE 130 may comprise 256 analog voltage signals sampled from four sensors (e.g., a gyroscope and three accelerometers) over 64 sampling periods. In this regard, device 101 may include the analog buffer(s) 120 to sample and hold the analog voltage signals from the sensor(s) 110.

The output of the DPE 130 may comprise an output vector of a second set of analog voltage signals that is derived from a vector dot product multiplication of the input vector of the first set of analog voltage signals (from sensor(s) 110 and/or analog buffer(s) 120) with a matrix comprising the resistance (or conductance) values of the memristors of the DPE 130. In one example, all or a portion of the second set of analog voltage signals in the output vector may be used for pattern matching/pattern detection. For instance, in one example the eight most significant bits (analog voltage signals) may be relevant for detecting a slip-and-fall pattern. In one example, one or more of the second set of analog voltage signals of the output vector of DPE 130 may be used as an activation signal to activate processor 140. For instance, processor 140 may be kept powered off or in a low power state until an activation signal is received. Thus, in one example, the processor 140 is activated upon a detection of a pattern by the DPE 130, Otherwise, power is conserved by maintaining the processor in the off state or a low power/power saving state.

Once activated, the processor 140 may engage in further processing of the sensor data. In one example, the second set of analog voltage signals of the output vector of DPE 130 may be converted to digital output signals by digital-to-analog converter(s) 141 which may be embedded in the processor 140, or which may comprise separate component(s) deployed between and coupled to the DPE 130 and the processor 140, respectively. For example, DPE 130 may be configured to detect a pattern of a slip-and-fall event, represented in the output vector of DPE 130, and to activate the processor 140 upon a detection of such an event. Thus, the processor 140 may be made aware that a particular pattern, e.g., a slip-and-fall event, has been detected by virtue of having been activated by the DPE 130. The processor 140 may be configured to perform various tasks, once activated. For example, the processor may be configured to send an alert to a monitoring device (not shown) via interface 150, to determine additional information from the digital output signals to send along with the alert, such as a force of an impact, a heart rate, and so forth.

In one example, processor 140 may further collect feedback information regarding an accuracy of a pattern detection. For example, a user of device 101 may manually input an indication that a slip-and-fall event has occurred. Processor 140 may then convey the feedback information to programming unit 170.

Programming unit 170 may then utilize the feedback information to train the matrix that models the neural network for improved accuracy. For instance, a detection of a slip-and-fall event by DPE 130 that is corroborated by a feedback information may reinforce the current model of the neural network as a positive example, while an incorrect pattern detection as indicated by the feedback information may serve as a negative example to further train the neural network model, i.e., the matrix comprising a linear representation of the neural network.

The foregoing describes just one example of the functioning of a system of the present disclosure. In other words, the system 100 may be utilized for various other purposes, such as for detecting an emergency condition in a refinery or power plant, for detecting a weather condition or a set of weather conditions that may be indicative of a particular risk, for detecting onset of a seizure, and so forth. In addition, various configurations and modifications of the system 100 may be provided in examples of the present disclosure. For instance, sensor(s) 110 are illustrated as components of the device 101. However, in another example, sensors 110 may comprise analog sensors that are external to device 101 and are connected to device 101 via electrical wiring for conveying analog voltage signals. In addition, in one example, noise may be reduced by using quantizers at the inputs and/or outputs of the DPE 130 to isolate noise between the DPE 130 and other components.

Similarly, programming unit 170 is illustrated as being external to device 101. For instance, device 101 may comprise a smartwatch, a heart rate monitor, or a similar wearable device, where processor 140 may comprise a microprocessor that may run a limited operating system, operate at low power, or which may otherwise have limited processing capabilities. In such examples, programming unit 170 may comprise a mobile phone of a user that is within near-field communication range of the interface 150, or may comprise a server of a vendor or service provider and/or a home computer of the user. However, in another example, programming unit 170 may be integrated in device 101. For instance, programming unit 170 and processor 140 may be combined into a single CPU, or programming unit 170 may comprise a separate component within device 101 that may connect to processor 140 via a Peripheral Component. Interface (PCI) express (PCIe) link, a Small Component Serial Interface (SCSI) link, and so forth. For instance, a mobile communication device, such as a smartphone with an embedded DPE, gyroscope, and accelerometers may be used to detect a pattern. In addition, the processor may have sufficient memory and processing speed to both program the DPE as well as to process the output of the DPE upon detection of a pattern. In general, processor 140 may comprise a low-power microcontroller, or may be an Acorn Reduced Instruction Set Computing (RISC) Machine (ARM)-based processor, an x86-based processor, and so forth.

In the example of FIG. 1, a single DPE 130 is illustrated. In general, a DPE may be programmed for detecting a pattern indicative of an event or a condition. Alternatively, or in addition, a DPE may be programmed/trained to detect a singular pattern comprising multiple conditions, e.g., a temperature over 95 degrees and humidity less than 10 percent. In one example, different portions of the DPE may be used to detect different things using one set of analog voltage signals. In one example, some portions of the DPE may be made redundant or simply not used. However, it should be noted that a device of the present disclosure may also include multiple DPEs to detect different patterns. For instance, a first DPE may be for detecting a humidity less than 10 percent, a second DPE may be for detecting a temperature greater than 95 degrees, and so on. In still another example, multiple DPEs may be cascaded for performing various pre-processing of analog sensor data before being fed to a processor. For instance, a first set of linear transformations may be applied to the analog sensor data by a first DPE, a second set of linear transformations may be applied by a second. DPE that receives all or a portion of the output vector of the first OPE as an input vector, and so on. Thus, these and other modification are all contemplated within the scope of the present disclosure.

Figure 2:
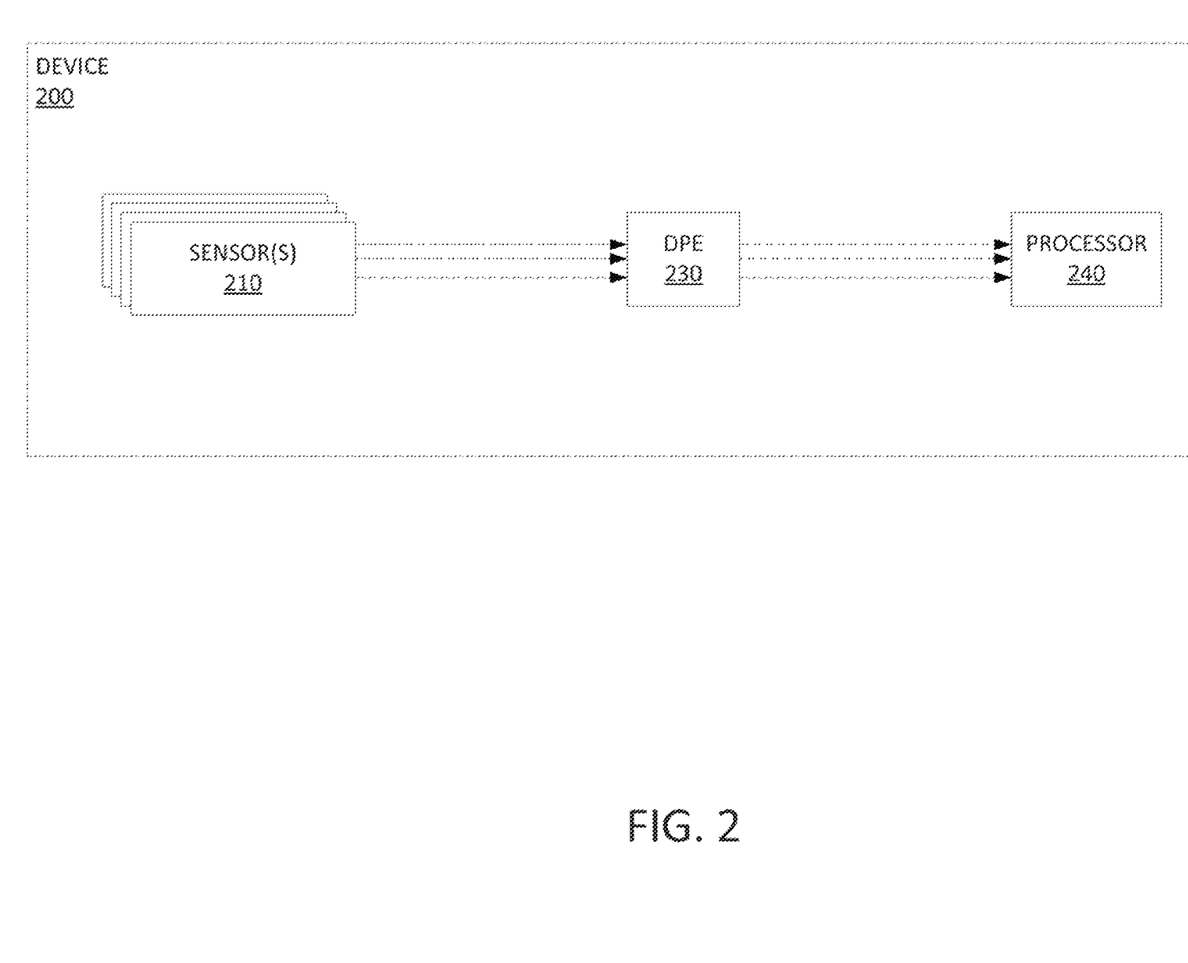
FIG. 2 illustrates an example device of the present disclosure.

FIG. 2 illustrates an example device 200 of the present disclosure. In one example, device 200 includes one or more sensor(s) 210 to generate a first set of analog voltage signals, a crossbar array comprising a plurality of memristors, e.g., DPE 230, and a processor 240. In one example, the DPE 230 is to receive an input vector of the first set of analog voltage signals, to generate an output vector comprising a second set of analog voltage signals that is based upon a dot product of the input vector and a matrix comprising resistance values of the plurality of memristors, to detect a pattern of the output vector, and to activate the processor 240 upon a detection of the pattern. In one example, device 200 may comprise a similar device to the device 101 illustrated in FIG. 1. For instance, sensor(s) 210 may be the same or similar components as the sensors 110 in FIG. 1, DPE 230 may comprise the same or a similar component as DPE 130, and processor 240 may comprise the same or a similar component as processor 140. In this regard, device 200 may include various additional components that are omitted from the example of FIG. 2, such as analog buffers, analog-to-digital converters, digital-to-analog converters, a programming unit, an interface (e.g., for external communications), and so forth. In addition, device 200 may be modified in various other ways. For instance, in one example, device 200 may omit sensor(s) 210. For example, sensor(s) 210 may be external to device 200, and may plug into device 200 via electrical wiring to convey sensor data as analog voltage signals. Thus, these and other modifications are all contemplated within the scope of the present disclosure.

Figure 3:
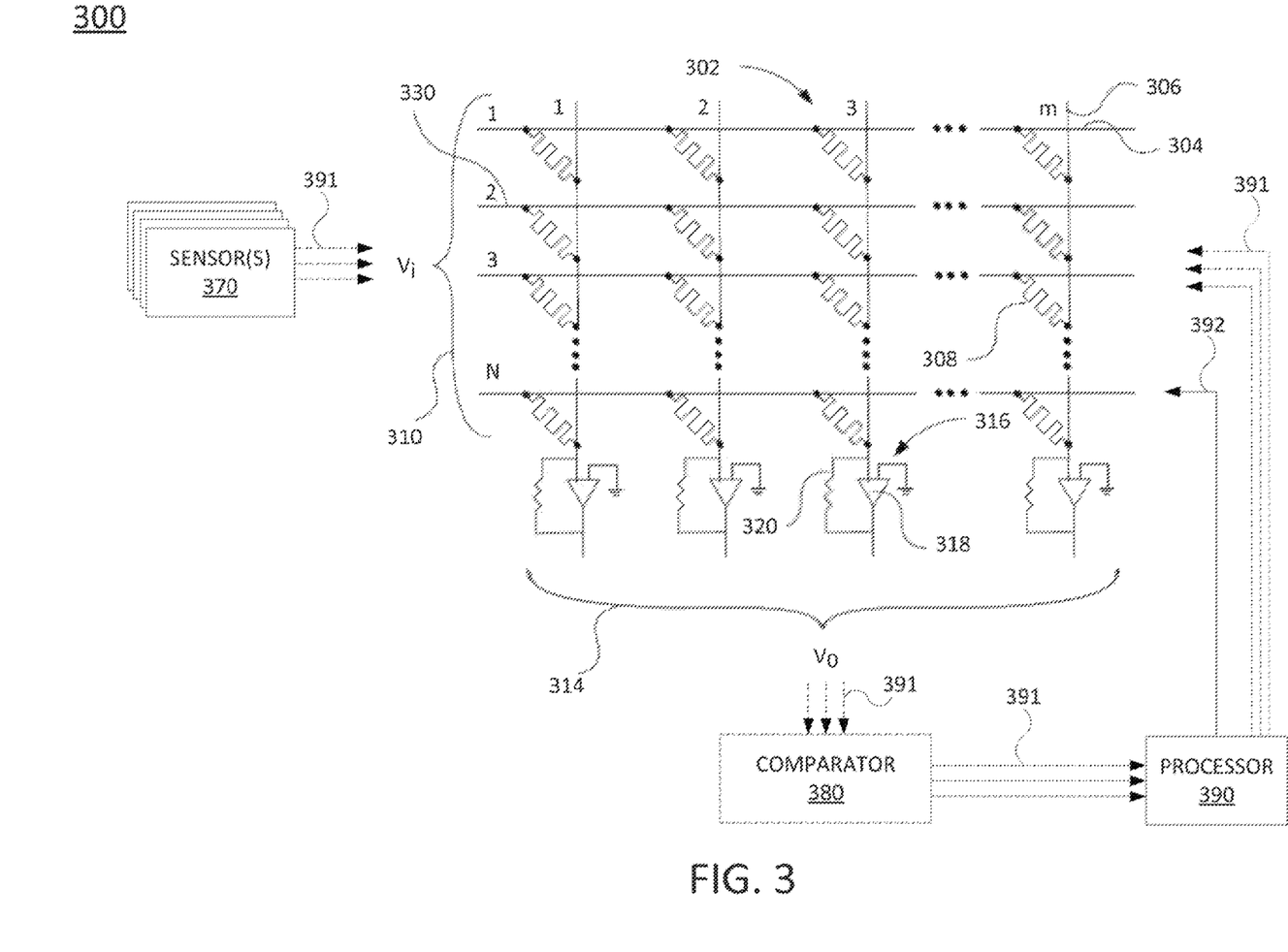
FIG. 3 illustrates an additional example device of the present disclosure.

FIG. 3 illustrates an example device 300 including a dot product engine (DPE), or crossbar array 302, for processing analog sensor data. As illustrated in FIG. 3, device 300 may include the crossbar array 302, one or more sensors 370, and a processor 390. The various components of device 300 may be interconnected by one or more links 391 for analog signals, and one or more links 392 for digital signals. The components of device 300 may comprise the same or similar components to those illustrated and described in connection with the example device 101 of FIG. 1 and/or device 200 of FIG. 2.

In one example, crossbar array 302 may include sense circuits 316. In one example, crossbar array 302 may further include a comparator 380, described in greater detail below. As illustrated in FIG. 3, the example crossbar array 302 may include N row electrodes 304 and M column electrodes 306. The junctions or cross points throughout the crossbar array 302 (where the row electrodes 304 cross the column electrodes 306) may each include a memristor 308. The crossbar array 302 may further include a vector input register 310 for applying an input vector comprising a first set of analog voltage signals to the row electrodes 304 and a vector output register 314 for receiving an output vector (e.g., a second set of analog voltage signals), resulting from current flows in the column electrodes 306. In one example, the sense circuits 316 are to convert an electrical current in a column electrode 306 to one of the second set of analog voltage signals in the output vector. For instance, the sense circuits 316 may each include an operational amplifier 318 and a resistor 320, which can be arranged to represent a virtual ground for read operations. The crossbar array 302 may also include other peripheral circuitry (not shown), such as drivers connected to the row electrodes 304 and address decoders to select a row electrode 304 and activate a driver corresponding to the selected row electrode 304. For example, a driver for a selected row electrode 304 can drive the selected row electrode 304 with different voltages for performing a vector-matrix multiplication or with voltages for setting resistance values of the memristors 308 of the crossbar array 302. Similar driver and decoder circuitry may be included for the column electrodes 306.

In one example, values in an N×M matrix are mapped to the memristors 308 in the crossbar array 302. For instance, a programming operation may be performed on the crossbar array 302 where one memristor 308 at a time is programmed. In one example, the matrix comprises a linear transform that may be determined by a programming unit to model a neural network for pattern detection. The values of the matrix may then be converted to programming signals, where a third set of analog voltage signals may be generated from the programming signals to program the respective memristors 308 to selected resistance (or conductance) values. The programming signals may be determined by the programming unit, or the matrix values may be provided to the processor 390 and mapped to the programming signals by the processor 390. In one example, the programming signals may be converted to the third set of analog voltage signals via one or more digital-to-analog converters (not shown), which may be components of the processor 390, or which may be deployed between the processor 390 and the crossbar array 302.

In one example, each of the resistance (or conductance) values is set by sequentially imposing a voltage drop over each of the junctions in the crossbar array 302. For example, the conductance value $G_{2,3}$ (where G is a matrix representing the conductances of memristors 308 in the crossbar array 302, and where $G_{2,3}$ represents the conductance of the memristor 308 in the second row and third column) may be set by applying a voltage equal to $V_{Row2}$ at the row electrode 304 at the second row of the crossbar array 302 (e.g., at location 330) and a voltage equal to $V_{Col3}$ at the column electrode 306 at the third column of the crossbar array 302. In one example, when applying a voltage at one of the column electrodes 306, the sense circuit 316 for the column electrode may be switched out and a voltage driver switched in. The voltage difference $V_{Row2}-V_{Col3}$ will generally determine the resulting conductance value $G_{2,3}$ based on the characteristics of the memristor 308 located at the crossbar junction where the second row electrode 304 crosses the third column electrode 306. When following this approach, the unselected row electrodes 304 and column electrodes 306 may be addressed according to one of several schemes, e.g., to isolate the unselected row electrodes 304 and column electrodes 306, and to minimize sneak path currents. For example, all unselected row electrodes 304 and column electrodes 306 may be floated (or alternatively, grounded). Other schemes may involve grounding unselected column electrodes 306 or grounding portions of unselected column electrodes 306.

In one example, the setting or programming of the memristors 308 may be performed by processor 390, or processor 390 via one or more digital-to-analog converters. For instance, processor 390 may generate the programming signals and other control signals, e.g., to control the drivers and address decoders of the crossbar array 302 for programming the memristors 308. The controls signals may be sent to crossbar array 302 via a link 392 for example. The particular resistance and/or conductance values may be selected based upon an operating range of the first set of analog voltage signals of the input vector at vector input register 310, based upon the programming threshold voltages of the memristors 308, based upon the voltage levels that the digital-to-analog converters can provide, and so on.

After the crossbar array 302 is programmed, the crossbar array 302 may then be used for dot-product or matrix multiplication operations for processing analog sensor data in accordance with the present disclosure. For example, an input vector of the first set of analog voltage signals is applied at vector input register 310 and an output vector of the second set of analog voltage signals is obtained at output vector 314, corresponding to the result of multiplying an N×M matrix (e.g., the crossbar array 302) by an N×1 vector (e.g., the input vector). In one example, the input analog voltage signals in the input vector are below a threshold voltage for programming the memristors 308. Thus, the resistance values of the memristors 308 are not changed during matrix multiplication operations.

In one example, vector and matrix multiplications may be performed through the crossbar array 302 by applying the input vector comprising the first set of analog voltage signals at vector input register 310 simultaneously along the row electrodes 304, collecting the currents through the column electrodes 306 and measuring the output analog voltage signals of the output vector $V_o$ at vector output register 314. For each column electrode 306, a respective input analog voltage signal from the input vector on one of the row electrodes 304 is weighted by a corresponding resistance, $1/G_{ij}$, where $G_{ij}$ is a conductance of the memristor 308 in the $i^{th}$ row and $j^{th}$ column of the crossbar array 302. The weighted summation is reflected at one of the output analog voltage signals at the vector output register 314 corresponding to the $j^{th}$ column. In one example, the relation between the input vector at vector input register 310 and the output vector at vector output register 314 can be represented by $V_o^T = -V_i^T \cdot G \cdot R_s$, where $V_o^T$ is the transpose of an output voltage vector, $V_i^T$ is the transpose of an input voltage vector, G is the conductance matrix of the crossbar array 302, including contributions from each memristor 308 in the crossbar array, and $R_s$ is a vector representing the resistances of resistors 320 in the sense circuits 316 at the output of each column electrode 306, and where the negative sign follows from use of a negative feedback operational amplifiers 318 in the sense circuits 316.

As mentioned above, in one example, crossbar array 302 may include a comparator 380 to determine whether a particular pattern is detected in the output vector at vector output register 314. For instance, it may desired to have a first of the output analog voltage signals in the output vector to be high, e.g., above a certain threshold for an analog voltage signal, when a particular pattern is detected. The particular pattern may vary depending upon the particular application and the programming of the crossbar array 302. For example, the pattern may be indicative of such things as: a person slipping and falling, a hazardous environmental condition, a hazardous condition in a lab, a manufacturing facility, a power plant, and so forth. In general, a set of training data may be utilized where, based upon an input vector that is indicative of an event or condition (such as a person falling down) a predicted output vector should result. In one example, the conductance matrix G of the crossbar array 302 is programmed such that the predicted output vector may include a first analog voltage signal being high when the pattern is detected. Thus, if the first analog voltage signal is high, this may serve as an activation signal to the processor. Accordingly, in one example, the comparator 380 may comprise a threshold comparator that compares the first output analog voltage signal to a reference voltage. However, in another example, the comparator 380 may detect a pattern based upon several of the output analog voltage signals in the output vector. For example, the comparator 380 may comprise several threshold comparators arranged in parallel and operating upon several output analog voltage signals of output vector, any one of which may serve to provide an activation signal to the processor 390. In still another example, comparator 380 is omitted. For instance one or more of the second set of analog voltage signals of the output vector may be fed directly to a dedicated port of the processor 390, where, if the signal fed to the port is over a threshold voltage, this may cause the processor to wake-up.

It should be noted that FIG. 3 illustrates just one example of a crossbar array, or dot product engine that may be used for processing analog sensor data in accordance with the present disclosure. For instance, in another example, a crossbar array may be provided that includes a transistor in series with the memristor, e.g., a depletion mode transistor, at each junction of the crossbar array. In such an example, the transistors may be activated for programming the crossbar array such that when programming a particular memristors, sneak path currents that may affect other memristors can be reduced. In addition, it should be noted that the descriptions of a "row" and "column" are provided for illustrative purposes. In other words, these labels should not be interpreted as connoting any particular orientation of the crossbar array 302. For instance, the row electrodes 304 and column electrodes 306 may be interchanged, where the vector output register may be associated with the row electrodes 304, rather than the column electrodes 306. Thus, these and other modifications are all contemplated within the scope of the present disclosure.

Figure 4:
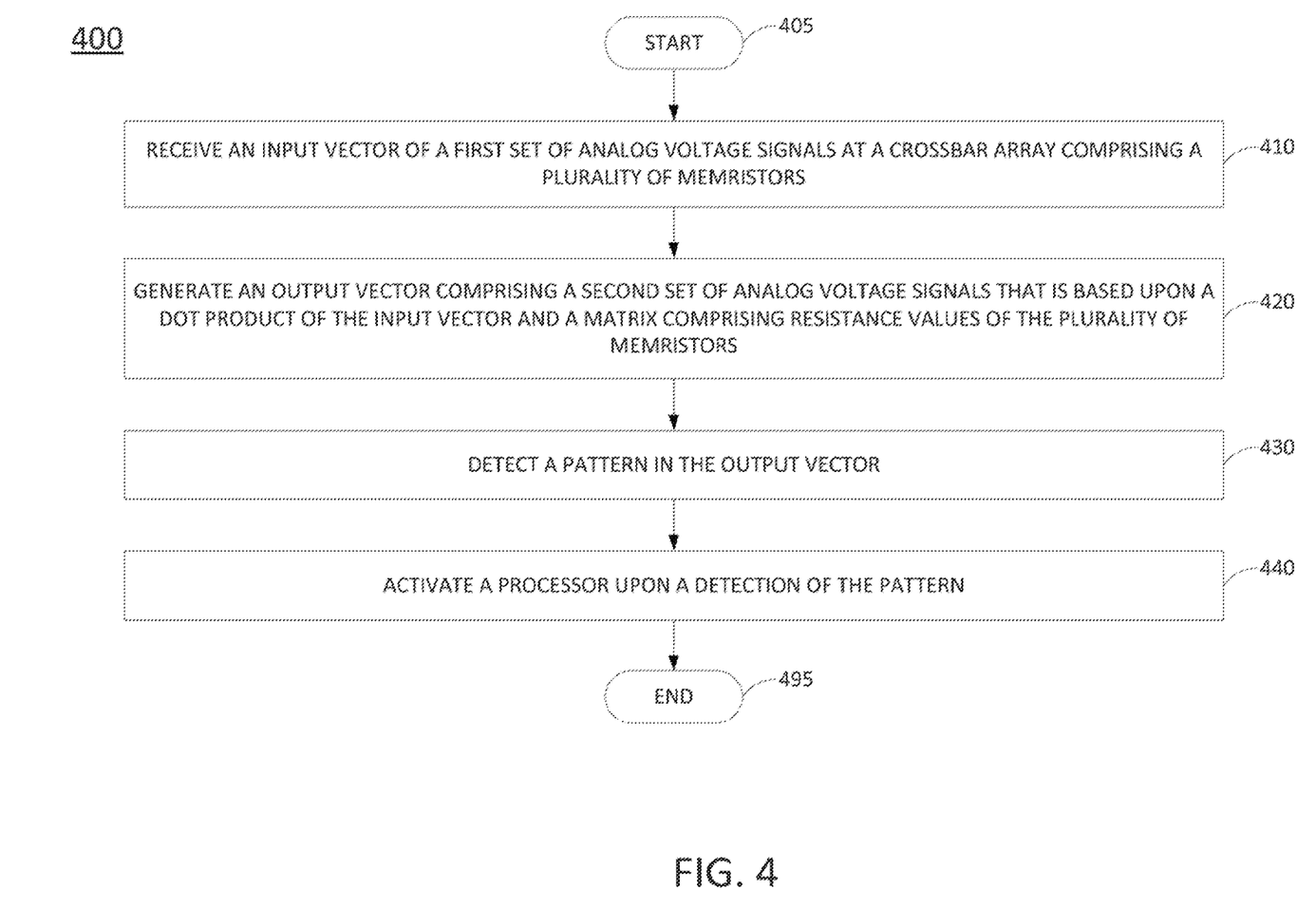
FIG. 4 illustrates an example method of the present disclosure.

FIG. 4 illustrates a flowchart of an example method 400 for processing analog sensor data. The method 400 may be performed, for example, by the system 100 of FIG. 1 the device 200 of FIG. 2, the device 300 of FIG. 3, or by at least one component of the system 100, device 200, or device 300. For example, the method 400 may be performed by a crossbar array or dot product engine (DPE) comprising a plurality of memristors, such as DPE 130 of FIG. 1, DPE 230 of FIG. 2, or crossbar array 302 of FIG. 3. However, the method 400 is not limited to implementation with the system and devices illustrated in FIGS. 1-3, but may be applied in connection with any number of systems and devices that include a crossbar array comprising a plurality of memristors for processing analog sensor data in accordance with the present disclosure. For illustrative purposes, the method 400 is described below in connection with an example where the method is performed by a crossbar array.

The method 400 begins in block 405 and proceeds to block 410. In block 410, the crossbar array may receive an input vector of a first set of analog voltage signals. In one example, the crossbar array may comprise a plurality of memristors deployed at the junctions between row and column electrodes of the crossbar array. In one example, the resistances (or conductances) of the memristors may have been programmed for the crossbar array to function as a linear transform representing a neural network for detecting a pattern in the sensor data. The pattern may be indicative of a particular condition or event, or a set of conditions or events.

In block 420, the crossbar array may generate an output vector comprising a second set of analog voltage signals that is based upon a dot product of the input vector and a matrix comprising resistance values of the plurality of memristors. For instance, as mentioned above, the resistances (or conductances) of the memristors of the crossbar array may have been programmed for the crossbar array to function as a linear transform representing a neural network for detecting a pattern in the sensor data. In one example, the relationship between the output vector and the input vector and the functioning of the crossbar array can be represented by $V_o^T = -V_i^T \cdot G \cdot R_s$, where $V_o^T$ is the transpose of an output vector comprising a second set of analog voltage signals, $V_i^T$ is the transpose of the input vector, G is the conductance matrix of the crossbar array (e.g., the transfer function), $R_s$ is a vector representing the resistances of sense circuits at the output of each column of the crossbar array, and where the negative sign follows from use of negative feedback operational amplifiers in the sense circuits.

In block 430, the crossbar array may detect a pattern in the output vector. For instance, in one example, a conductance matrix of the crossbar array may be programmed to drive one of the output analog voltage signals of the output vector to a particular state when the pattern is detected. For example, the output analog voltage signal may be over a certain threshold voltage when the pattern is detected. In another example, a pattern may be detected based upon several of the output analog voltage signals in the output vector.

In block 440, the crossbar array may activate a processor upon a detection of the pattern. For example, one or more of the output analog voltage signals of the crossbar array may comprise an input to a dedicated port of the processor, e.g., an interrupt port for activating the processor. In one example, the one or more output analog voltage signals may be compared to a threshold via a comparator, or may be processed via additional circuitry before being fed to the processor as an activation signal. When it is detected at block 430 that the pattern is detected, a signal sent from the crossbar array to the processor may cause the processor to transition from a power-off or low-power state to an active state. The output vector of the crossbar array may also be digitized and provided to the processor as digital output data. The processor may then perform additional tasks in relation to the digital output data.

Following block 440, the method 400 proceeds to block 495 where the method ends.

Figure 5:
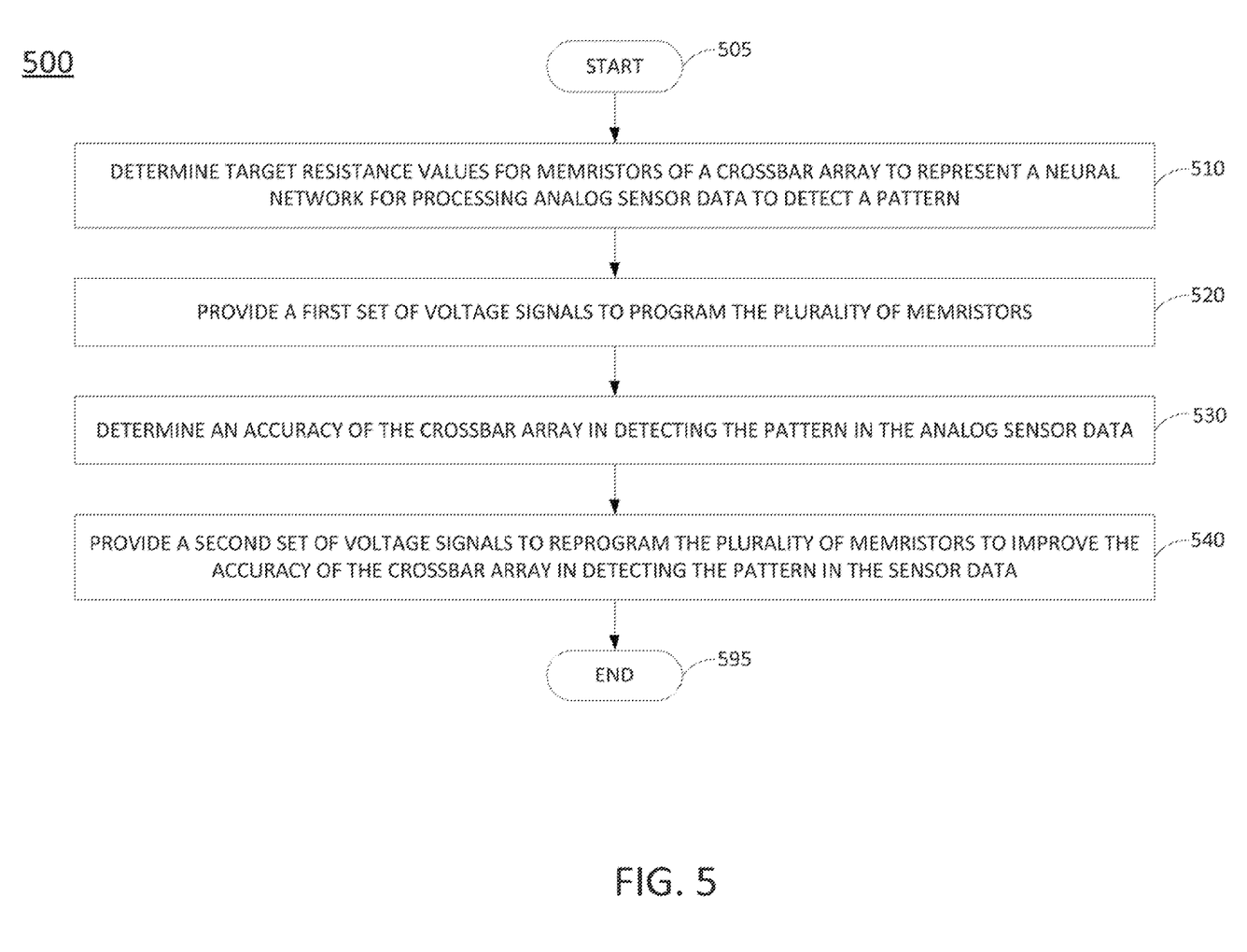
FIG. 5 illustrates an additional example method of the present disclosure.

FIG. 5 illustrates a flowchart of an example method 500 for programming a memristor-based crossbar array to detect a pattern in analog sensor data. The method 500 may be performed, for example, by any one or more of the components of system 100 of FIG. 1, device 200 of FIG. 2, or device 300 if FIG. 3. For example, the method 500 may be performed by programming unit 170 or processor 140 of FIG. 1, by processor 240 of FIG. 2, by processor 390 of FIG. 3, by a combination of processor 140 and programming unit 170, and so forth. Alternatively, or in addition, at least one of the blocks of the method 500 may be implemented by a computing device having a processor, a memory, and input/output devices as illustrated below in FIG. 6, specifically programmed to perform the blocks of the method. Although any one of the elements in system 100, or in a similar system, may be configured to perform various blocks of the method 500, the method will now be described in terms of an example where blocks of the method are performed by a processor, such as processor 602 in FIG. 6. For instance, processor 602 may represent a processor of a programming unit or of a processor as described in FIGS. 1-3 above. As used in connection with the description of FIG. 6, the term "processor" may also include multiple processors, hardware state machines, or hardware logic units, e.g., an application specific integrated circuit (ASIC), a programmable logic device (PLD), such as a field programmable gate array (FPGA), and so forth.

The method 500 begins in block 505 and proceeds to block 510. In block 510, the processor may determine target resistance values for memristors of a crossbar array. The target resistances values may be for the crossbar array to represent a neural network for processing analog sensor data to detect a pattern. In one example, the processor determines a matrix. e.g., a linear transform or linear filter, that best approximates a neural network to perform a particular function, such as a pattern detection. The processor may then map the matrix to target resistance values for the memristors of the crossbar array in order for the crossbar array to represent the neural network.

In block 520, the processor may provide a first set of voltage signals to program the plurality of memristors. In one example, the first set of voltage signals may be generated based upon the target resistance values determined at block 510. In one example, the first set of voltage signals may be further based upon characteristics of the memristors in the crossbar array, such as threshold voltages for programming/setting/resetting the memristors. In one example, block 520 may include applying the first set of voltage signals to the memristors in the crossbar array to program the resistances of the respective memristors.

In block 530, the processor may determine an accuracy of the crossbar array in detecting the pattern in the analog sensor data. In one example, block 530 may comprise injecting one or more test input vectors to the crossbar array, reading the output vector(s), and determining a deviation of the output vector from an expected output vector. When there is a deviation, it may be determined that one or more adjustments should be made to one or more of the memristor resistances (or conductances) in order to better approximate the neural network and to improve the accuracy of the crossbar array in detecting the pattern. For instance, due to variations of the memristors physical properties, wire resistances, input resistance, output resistance, shot noise, Johnson noise, and other factors, the memristors may not actually take on the target values. In one example, block 530 may comprise receiving feedback information regarding the accuracy of the crossbar array in detecting the pattern. For example, the crossbar array may be programmed to detect a slip-and-fall event. If a slip-and-fall event is detected by the crossbar array and feedback information (e.g., manually provided by a user) confirms that a slip-and-fall event occurred, this may be used to reinforce the current model of the neural network as a positive example, while an incorrect pattern detection as indicated by the feedback information may serve as a negative example to further train the neural network model, i.e., the matrix comprising a linear representation of the neural network.

In block 540, the processor may provide a second set of voltage signals to reprogram the plurality of memristors to improve the accuracy of the crossbar array in detecting the pattern in the sensor data. For instance, as mentioned above, due to variations of the memristors physical properties, wire resistances, input resistance, output resistance, shot noise, Johnson noise, and other factors, the memristors may not actually take on the target values. In addition, the matrix representing the neural network as a linear transform or transfer function may be imperfectly trained due to a variety of factors, such as a limited training data set, an insufficient number of training runs to optimize the matrix, a natural variation in the types of physical parameters that may comprise the pattern, and so on. Accordingly, any deviations from a target representation of the neural network determined at block 530 or any negative feedback information received at block 530 may be used to reprogram the memristor resistances to better match the target resistances and/or to recalculate target resistances and then reprogram the memristor resistances accordingly. For example, adjusting the resistance values of the memristors of the crossbar array may be to minimize a miss ratio and/or maximize a hit ratio of the crossbar array in detecting the pattern.

Following block 540, the method 500 proceeds to block 595 where the method ends.

It should be noted that although not explicitly specified, at least one of the blocks, functions, or operations of the methods 400 and 500 described above may include storing, displaying, and/or outputting. In other words, any data, records, fields, and/or intermediate results discussed in the methods can be stored, displayed, and/or outputted to another device depending on the particular application. Furthermore, blocks, functions, or operations in FIGS. 4 and 5 that recite a determining operation, or involve a decision, do not necessarily imply that both branches of the determining operation are practiced. In other words, one of the branches of the determining operation can be deemed as optional.

FIG. 6 depicts an example high-level block diagram of a computing device suitable for use in performing the functions described herein. As depicted in FIG. 6, the computer 600 comprises a hardware processor element 602, e.g., a central processing unit (CPU), a microprocessor, or a multi-core processor, a memory 604, e.g., random access memory (RAM), a module 605 for programming a memristor-based crossbar array to detect a pattern in analog sensor data, and various input/output devices 606, e.g., storage devices, including but not limited to, a tape drive, a floppy drive, a hard disk drive or a compact disk drive, a receiver, a transmitter, a speaker, a display, a speech synthesizer, an output port, an input port and a user input device, such as a keyboard, a keypad, a mouse, a microphone, and the like. Although one processor element is shown, it should be noted that the computer may employ a plurality of processor elements. Furthermore, although one computer is shown in the figure, if the method(s) as discussed above is implemented in a distributed or parallel manner for a particular illustrative example, i.e., the blocks of the above method(s) or the entire method(s) are implemented across multiple or parallel computers, then the computer of this figure is intended to represent each of those multiple computers.

It should be noted that the present disclosure can be implemented by machine readable instructions and/or in a combination of machine readable instructions and hardware, e.g., using application specific integrated circuits (ASIC), a programmable logic array (PLA), including a field-programmable gate array (FPGA), or a state machine deployed on a hardware device, a computer or any other hardware equivalents, e.g., computer readable instructions pertaining to the method(s) discussed above can be used to configure a hardware processor to perform the blocks, functions and/or operations of the above disclosed methods.

In one example, instructions and data for the present module or process 605 for programming a memristor-based crossbar array to detect a pattern in analog sensor data, e.g., machine readable instructions, can be loaded into memory 604 and executed by hardware processor element 602 to implement the blocks, functions, or operations as discussed above in connection with the example method 500. For instance, the module 605 may include a plurality of computer-readable components, including a determining target resistance values component 611, a providing a first set of voltage signals component 612, a determining an accuracy of a crossbar array component 613, a providing a second set of voltage signals component 614, and an additional functions component 615. When executed by the hardware processor element 602 the determining target resistance values component 611 may cause the hardware processor element 602 to determine target resistance values for memristors of a crossbar array to represent a neural network for processing analog sensor data to detect a pattern, the providing a first set of voltage signals component 612 may cause the hardware processor element 602 to provide a first set of voltage signal to program a plurality of memristors of the crossbar array, where the first set of voltage signals may be generated based upon the target resistance values determined by the providing a first set of voltage signals component 612, the determining an accuracy of a crossbar array component 613 may cause the hardware processor element 602 to determine an accuracy of the crossbar array in detecting the pattern in the analog sensor data, e.g., by injecting one or more test input vectors to the crossbar array and/or by receiving feedback information, and the providing a second set of voltage signals component 614 may cause the hardware processor element 602 to provide a second set of voltage signals to reprogram the plurality of memristors to improve the accuracy of the crossbar array in detecting the pattern in the sensor data, e.g., as per the method 500 above. When executed by the hardware processor element 602, the additional functions component 615 may cause the hardware processor element 602 to perform additional functions, e.g., in connection with the method 500 as described above, and/or to perform any one or more additional functions as described in the present disclosure. The foregoing is just one example configuration of module 605 in accordance with the present disclosure. Furthermore, when a hardware processor executes instructions to perform "operations," this could include the hardware processor performing the operations directly and/or facilitating, directing, or cooperating with another hardware device or component, e.g., a co-processor and the like, to perform the operations.

The processor executing the machine readable instructions relating to the above described method(s) can be perceived as a programmed processor or a specialized processor. As such, the present module 605 for programming a memristor-based crossbar array to detect a pattern in analog sensor data, including associated data structures, of the present disclosure can be stored on a tangible or physical (broadly non-transitory) computer-readable storage device or medium, e.g., volatile memory, non-volatile memory, ROM memory, RAM memory, magnetic or optical drive, device or diskette and the like. Furthermore, the computer-readable storage device may comprise any physical device or devices that provide the ability to store information such as data and/or instructions to be accessed by a processor or a computing device such as a computer or an application server.

It will be appreciated that variants of the above-disclosed and other features and functions, or alternatives thereof, may be combined into many other different systems or applications. Various presently unforeseen or unanticipated alternatives, modifications, or variations therein may be subsequently made, which are also intended to be encompassed by the following claims.

What is claimed is:

1. A device, comprising:
at least one analog sensor to generate a first set of analog voltage signals;
a crossbar array comprising a plurality of memristors, the crossbar array configured to:
receive an input vector of the first set of analog voltage signals;
generate an output vector comprising a second set of analog voltage signals that is based upon a dot product of the input vector and a matrix comprising resistance values of the plurality of memristors, and
detect a pattern of the output vector; and
a processor configured to:
activate when at least a portion of the second set of analog voltage signals match a pattern,
map matrix values into programming signals to generate a third set of analog voltage signals based on the programming signals, and
provide the third set of analog voltage signals to reprogram the plurality of memristors of the crossbar array.

2. The device of claim 1, wherein the processor comprises a digital microprocessor.

3. The device of claim 2, wherein the processor is to remain off or in a low power state until the processor is activated by the crossbar array.

4. The device of claim 2, further comprising:
a set of digital-to-analog converters coupled to the processor and to the crossbar array to output a third set of analog voltage signals to program the resistance values of the plurality of memristors.

5. The device of claim 1, wherein the crossbar array comprises a set of sense circuits to convert output currents of a plurality of rows or a plurality of columns of the crossbar array to the second set of analog voltage signals.

6. The device of claim 1, further comprising:
a set of analog buffers to sample and hold the first set of analog voltage signals and to feed the first set of analog voltage signals to the crossbar array.

7. The device of claim 1, further comprising:
a set of analog-to-digital converters to convert the second set of analog voltage signals to a set of digital output signals.

8. The device of claim 1, wherein the resistance values of the plurality of memristors are to cause the crossbar array to function as a neural network.

9. The device of claim 1, wherein at least one of the second set of analog voltage signals of the output vector is to function as an activation signal to activate the processor.

10. A system, comprising:
at least one analog sensor to generate a first set of analog voltage signals;
a crossbar array comprising a plurality of memristors, the crossbar array configured to:
generate a second set of analog voltage signals that is based upon the first set of analog voltage signals and resistance values of the plurality of memristors;
a processor configured to:
activate when at least a portion of the second set of analog voltage signals match a pattern, and
map matrix values into programming signals to generate a third set of analog voltage signals based on the programming signals; and
a programming unit to determine the resistance values of the plurality of memristors.

11. The system of claim 10, further comprising:
a wireless communication interface for communications between the programming unit and the processor.

12. The system of claim 10, wherein the programming unit comprises a remote network-based component.

13. The system of claim 10, wherein the third set of analog voltage signals are used to by the programming unit to program the resistance values of the plurality of memristors.

14. A device, comprising:
a processor; and
a non-transitory computer-readable medium storing instructions which, when executed by the processor, cause the processor to:
determine target resistance values for a plurality of memristors of a crossbar array to represent a neural network for processing analog sensor data to detect a pattern;
provide a first set of voltage signals to program the plurality of memristors of the crossbar array, the first set of voltage signals based upon the target resistance values;
determine an accuracy of the crossbar array in detecting the pattern in the analog sensor data;
provide a second set of voltage signals to reprogram the plurality of memristors to improve the accuracy of the crossbar array in detecting the pattern in the analog sensor data;
map matrix values into programming signals to generate a third set of voltage signals based on the programming signals; and
provide the third set of voltage signals to reprogram the plurality of memristors of the crossbar array.

15. The device of claim 14, wherein the instructions, when executed by the processor, further cause the processor to:
inject a test input vector to the crossbar array;
read an output vector from the crossbar array; and
determine a deviation of the output vector from an expected output vector.

16. The device of claim 14, wherein the instructions, when executed by the processor, further cause the processor to:
apply the first set of voltage signals to the plurality of memristors in the crossbar array to program resistances of the plurality of memristors.

* * * * *